United States Patent [19]
Amano et al.

[11] Patent Number: 6,129,045
[45] Date of Patent: Oct. 10, 2000

[54] APPARATUS AND METHOD FOR EXCHANGING AN ATMOSPHERE OF SPHERICAL OBJECT

[75] Inventors: Katsumi Amano, Fukuoka; Tashiro Arai, Kanagawa, both of Japan

[73] Assignees: Mitsui High-tec Inc., Fukuoka; Nippon Pneumatics/Fluidics System Co., Ltd., Kanagawa, both of Japan

[21] Appl. No.: 09/110,659

[22] Filed: Jul. 7, 1998

[51] Int. Cl.$^7$ .......................... C23C 16/00; C30B 25/14
[52] U.S. Cl. .......................... 118/716; 118/715; 118/718; 118/719; 117/88; 117/204; 134/60; 134/61; 134/102.2; 134/902
[58] Field of Search ........................ 118/716, 715, 118/718, 719; 438/63; 136/250; 117/88, 204; 422/145, 245.1; 34/583, 588, 591, 78; 134/60, 61, 88, 102.2, 102.3, 902; 209/710, 932

[56] References Cited

U.S. PATENT DOCUMENTS

| | | | |
|---|---|---|---|
| 3,251,337 | 5/1966 | Latta et al. | 118/716 |
| 4,022,152 | 5/1977 | Laufer et al. | 118/716 |
| 4,116,160 | 9/1978 | Langley et al. | 118/716 |
| 6,004,396 | 12/1999 | Ishikawa | 118/715 |
| 6,022,415 | 2/2000 | Amano | 118/719 |
| 6,049,996 | 4/2000 | Freeman et al. | 34/362 |
| 6,053,667 | 4/2000 | Sakai et al. | 406/56 |

*Primary Examiner*—Jeffrie R Lund
*Attorney, Agent, or Firm*—Greenblum & Bernstein, P.L.C.

[57] ABSTRACT

A spherical object transport apparatus of the invention brings a spiral stream into contact with a first atmosphere containing a spherical object, selectively sucks the first atmosphere outward so as to engulf in the spiral stream for diffusing the first atmosphere outward, guides the spherical object so that the spherical object passes through the center of the transport apparatus, supplies a second atmosphere to the spherical object, and sends the spherical object together with the second atmosphere to the following step.

18 Claims, 6 Drawing Sheets

APPARATUS AND METHOD FOR EXCHANGING AN ATMOSPHERE OF SPHERICAL OBJECT

BACKGROUND OF THE INVENTION

1. Field of the Invention

This invention relates to an apparatus and method for exchanging an atmosphere of spherical object and more particularly to a spherical object conveying apparatus having a function of exchanging a conveying atmosphere when conveying spherical objects of spherical single crystal silicon, etc., through different atmospheres.

2. Description of the Related Art

Hitherto, normally, to form semiconductor devices, a method of forming a circuit pattern on a silicon wafer and dicing it as required for forming semiconductor chips has been adopted. In recent years, an art of forming a circuit pattern on a ball semiconductor of spherical single crystal silicon, etc., having a diameter of 1 mm or less and manufacturing semiconductor elements thereon has been developed.

For example, to use spherical single crystal silicon to form discrete devices of solar batteries, optical sensors, etc., or semiconductor integrated circuits, various treatment steps of a mirror surface grinding step of spherical single crystal silicon, a washing step, a thin film formation step, a resist application step, a photolithography step, an etching step, etc., are required. To efficiently manufacture the spherical semiconductor devices, the treatment steps need to be concatenated to form a line.

However, the treatment steps are executed in various atmospheres containing not only gases of active gases, inert gases, etc., but also liquids of water, solutions, etc. To concatenate such treatment steps, the treated substance transport atmosphere must not be brought into the following step from the preceding step. Thus, it is necessary to remove the atmosphere in the preceding step from the treated substance between steps and convert (exchange) into an atmosphere fitted to the following step. Moreover, to do this, high-speed treatment and high reliability are required from the points of productivity and quality.

When the treatment steps are concatenated to form a line, if spherical silicon conveyed from the preceding step is supplied to the following step irregularly, the supplied spherical silicon amount changes in the step. Thus, the treatment conditions must be changed in conformance with the change amount; efficient treatment cannot be executed.

Then, spherical objects of spherical silicon, etc., need to be supplied to the following step in sequence at given regular intervals. A silicon surface is easily oxidized and if a natural oxide film is formed on the surface, the contact property with a metal electrode layer, etc., formed on the surface (oxide film) worsens. It is desirable to convey and treat the spherical objects in a closed space without coming in contact with outer atmosphere.

SUMMARY OF THE INVENTION

It is therefore an object of the invention to provide a spherical object conveying apparatus that can convert an atmosphere while conveying a spherical object at high speed and prevent the atmosphere from leaking between consecutive treatment steps without the need for a complicated mechanism. Particularly, it is an object of the invention to execute semiconductor treatment such as film formation treatment and etching treatment of a spherical semiconductor of spherical single crystal silicon, etc., at high speed and reliably.

Then, the spherical object conveying apparatus of the invention brings a spiral stream into contact with a first atmosphere containing a spherical object at an opening of the spiral stream, selectively sucks the first atmosphere outward so as to engulf in the spiral stream for diffusing the first atmosphere outward from the spherical object, guides the spherical object so that the spherical object passes through the center of the conveying apparatus, supplies a second atmosphere to the spherical object, and sends the spherical object together with the second atmosphere to the following step.

Thus, the conveying apparatus of the invention uses an spiral stream for engulfing the first atmosphere and forming a negative pressure state in a center of the spiral. Namely the conveying apparatus of the invention uses the spiral stream to introduce the first atmosphere gas outward for placing a portion in the proximity of the center in a negative pressure state and supplies the second atmosphere gas to the portion; it can convert the atmosphere in treatment of a spherical object of spherical single crystal silicon, etc., without the need for a complicated mechanism.

A first aspect of the apparatus is an apparatus for exchanging an atmosphere of spherical object of the present invention, which comprises:

spiral stream formation means for allowing a carrier fluid to flow in from a tangent direction of a tubular flow passage and forming an spiral stream of the carrier fluid;

a supply pipe for supplying a spherical object together with a first atmosphere;

a first atmosphere suction and discharge section for bringing the first atmosphere containing the spherical object into contact with the spiral stream in the proximity of an exit of said supply pipe for guiding the spherical object so that the spherical object passes through a center and selectively sucking outward and discharging the first atmosphere together with the spiral stream for removing the first atmosphere; and a second atmosphere supply section for supplying a second fluid for forming a second atmosphere to the spherical object sent out from said suction and discharge section for sending out the spherical object together with the second fluid.

According to the configuration, an spiral stream is formed, the first atmosphere containing the spherical object is brought into contact with the spiral stream at the spout opening of the spiral stream, the first atmosphere together with the spiral stream is selectively sucked outward and discharged for removing the first atmosphere, the spherical object is guided so that the spherical object passes through the center, thereby well removing the first atmosphere, and when a negative pressure state is entered, the second fluid is supplied, whereby the atmosphere can be replaced efficiently. Since the first atmosphere can be accelerated while it is engulfed by the spiral stream and can be diffused outward, so that more efficient exhaust is enabled.

Since conveying in a small closed space is enabled, replacement is enabled in a small amount of atmosphere. Formation is enabled by an extremely simply apparatus without the need for a complicated mechanism.

A second aspect is an apparatus for exchanging an atmosphere of spherical object according to the first aspect, wherein said first atmosphere suction and discharge section comprises:

an inner pipe being connected to a point in the proximity of the exit of said supply pip e for enabling a fluid to flow in and out and defining a passage of the spherical object in said inner pipe; and a discharge chamber surrounding said inner pipe.

According to the configuration, the inner pipe enabling a fluid to flow in and out can prevent the spherical object from scattering; the atmosphere can be removed efficiently.

A third aspect is an apparatus for exchanging an atmosphere of spherical object according to the second aspect, wherein said discharge chamber is a cylindrical pipe formed so as to surround said inner pipe for discharging through discharge holes disposed on an outer peripheral surface in the proximity of a downstream end.

According to the configuration, exhaust is executed outward, thus an outward flow can be formed in the discharge chamber and the flow of the spiral stream engulfing the first atmosphere can be efficiently introduced outward.

A fourth aspect is an apparatus for exchanging an atmosphere of spherical object according to the second aspect, wherein the discharge holes comprise a plurality of holes arranged at predetermined intervals on the same circumference along the outer peripheral surface.

According to the configuration, the spiral stream can be furthermore efficiently introduced outward.

A fifth aspect is an apparatus for exchanging an atmosphere of spherical object according to the fourth aspect, wherein the first atmosphere and the spiral stream are made of gases, further including a vacuum chamber disposed like a belt on the outer peripheral surface of said discharge chamber so as to surround all the holes, said vacuum chamber comprising a vacuum pump for discharging the first atmosphere to the outside.

According to the configuration, the spiral stream efficiently introduced outward is introduced efficiently into the outward vacuum chamber from the outer peripheral surface of the discharge chamber. Air is discharged from the vacuum chamber by the discharge pump, whereby the spiral stream is introduced uniformly in a rectification state in the outer peripheral direction of the discharge chamber even though exhaust is executed in one direction; removal efficiency can be furthermore improved.

A sixth aspect is an apparatus for exchanging an atmosphere of spherical object according to the third aspect, wherein said inner pipe is a porous pipe made of a porous material formed so as to define a passage having a diameter slightly larger than that of the spherical object in said pipe.

A seventh aspect is an apparatus for exchanging an atmosphere of spherical object according to the third aspect, wherein said inner pipe is a pipe having a large number of through holes each having a diameter smaller than that of the spherical object for enabling the first atmosphere to pass therethrough.

An eighth aspect is an apparatus for exchanging an atmosphere of spherical object according to the third aspect, wherein said inner pipe is a pipe formed of a mesh material capable of preventing the spherical object from flowing out to the outside.

A ninth aspect is an apparatus for exchanging an atmosphere of spherical object according to the second aspect, wherein said discharge chamber is a cylindrical pipe formed so as to surround said inner pipe with an inner peripheral surface forming a taper face enlarged downstream and approaching an outer peripheral surface of said cylindrical pipe for introducing the spiral stream into the outside.

A tenth aspect is an apparatus for exchanging an atmosphere of spherical object according to the ninth aspect, wherein the spiral stream is introduced through a discharge hole made in a downstream end of the taper face.

An eleventh aspect is an apparatus for exchanging an atmosphere of spherical object according to the first aspect, wherein said first atmosphere suction and discharge section comprises:

a straight pipe section made of a porous material being connected to a point in the proximity of the exit of said supply pipe for enabling a fluid to flow in and out and defining a passage of the spherical object in said straight pipe section;

a taper section having an inner peripheral surface forming a taper face enlarged downstream and approaching an outer peripheral surface for introducing the spiral stream into the outside; and a discharge chamber formed so as to surround at least said straight pipe section.

A twelfth aspect is an apparatus for exchanging an atmosphere of spherical object according to the first aspect, wherein said spiral stream formation means comprises a tubular body disposed so as to define an spiral stream passage outside said supply pipe and fluid supply means for supplying a fluid from a tangent direction to a point in the proximity of an upstream end on an outer peripheral surface of said tubular body, wherein said fluid supply means causes a fluid to blow into from the tangent direction of the outer periphery of the passage, thereby forming an spiral stream along the passage.

A thirteenth aspect is an apparatus for exchanging an atmosphere of spherical object according to the twelfth aspect, wherein the spiral stream passage comprises an opening for injection at a downstream end.

A fourteenth aspect is an apparatus for exchanging an atmosphere of spherical object according to the twelfth aspect, wherein the spiral stream passage comprises:

a straight section surrounded by an outer peripheral surface of a straight inner pipe and an inner peripheral surface of an outer pipe and defined so that cross-sectional area becomes equal; and an opening for injection at a downstream end, being connected to said straight section.

A fifteenth aspect is an apparatus for exchanging an atmosphere of spherical object according to the twelfth aspect, wherein the spherical object is single crystal silicon and the fluid is inert gas.

A sixteenth aspect is an apparatus for exchanging an atmosphere of spherical object according to the thirteenth aspect, wherein the fluid is a gas for forming the second atmosphere.

A seventeenth aspect is an apparatus for exchanging an atmosphere of spherical object according to the first aspect, wherein said spiral stream formation means forms an spiral stream of inert gas controlled to a cooling temperature.

An eighteenth aspect is an apparatus for exchanging an atmosphere of spherical object according to the first aspect, wherein said second atmosphere supply section comprises pulse generation means for supplying the second fluid as a pressurizing pulse and accelerates and sends the spherical object.

A nineteenth aspect is a method of exchanging an atmosphere of spherical object of the present invention, which comprises:

an spiral stream formation step of allowing a carrier fluid to flow in from a tangent direction of a tubular flow passage and forming an spiral stream of the carrier fluid;

a spherical object-containing fluid supply step of supplying a spherical object together with a fluid for forming a first atmosphere along a center axis in the spiral of the spiral stream;

a first atmosphere suction and discharge step of bringing the spherical object-containing fluid into contact with the spiral stream for guiding the spherical object so that the spherical object passes through a center and selectively sucking the first atmosphere together with the spiral stream outward for discharging the first atmosphere; and a second atmosphere supply step of spouting a second fluid for forming a second atmosphere to the spherical object with the first atmosphere discharged in said suction and discharge step, accelerating the spherical object, and sending out the spherical object together with the second fluid.

A twentieth aspect is a method for exchanging an atmosphere of spherical object according to the nineteenth aspect, which comprises:

a first reaction step of supplying a first reactive gas to a semiconductor ball for executing a first reaction;

an spiral stream formation step of allowing a second gas as a carrier fluid to flow in from a tangent direction of a tubular flow passage and forming an spiral stream;

a supply step of supplying the semiconductor ball subjected to said first reaction step together with the first reactive gas along a center axis in the spiral of the spiral stream;

a step of bringing the first reactive gas containing the semiconductor ball into contact with the spiral stream for guiding the spherical object so that the spherical object passes through a center and selectively sucking the first reactive gas together with the spiral stream outward for discharging the first reactive gas; and a step of spouting a third gas to the semiconductor ball, accelerating the spherical object, and introducing the spherical object into said second reaction step.

A twenty first aspect is a method for exchanging an atmosphere of spherical object according to the twentieth aspect, wherein the second gas is inert gas.

A twenty second aspect is a method for exchanging an atmosphere of spherical object according to the twenty first aspect, wherein the second gas is the same gas as the third gas.

A twenty third aspect is a method for exchanging an atmosphere of spherical object according to the twentieth aspect, wherein said first reaction step is a vapor phase growth step, wherein the second gas is inert gas cooled to a reaction temperature of the first reactive gas or less, and wherein the semiconductor ball is brought into contact with a spiral stream of the cooled inert gas, thereby cooling the semiconductor ball and replacing with inert gas.

A twenty fourth aspect is a method for exchanging an atmosphere of spherical object according to the twenty third aspect, wherein said second reaction step is a step of supplying reactive gas as said third gas.

A twenty fifth aspect is a method for exchanging an atmosphere of spherical object according to the twenty third aspect, wherein the spherical object is spherical single crystal silicon, wherein said first reaction step is a nitriding treatment step of supplying a nitrogen-containing gas controlled to a nitriding treatment temperature and performing nitrogen annealing, wherein the carrier fluid is cooled inert gas, and wherein said second reaction step is a step of supplying a gas under a room temperature for causing a reaction to occur.

To accelerate the spherical object in the sending section, a plurality of piezoelectric elements may be attached to the sending pipe at predetermined intervals and the inner diameter of the sending pipe may become locally small. According to the configuration, the spherical object can be conveyed at predetermined intervals.

In the specification, the "atmosphere" contains not only gases of active gases, inert gases, etc., but also liquids of water, solutions, etc., and the "spherical object" contains spherical object not only of spherical silicon, but also of various materials requiring treatment in various atmospheres.

DESCRIPTION OF THE PREFERRED EMBODIMENTS

Referring now to the accompanying drawings, there are shown preferred embodiments of the invention.

Figures 1A, 1B, 1C:
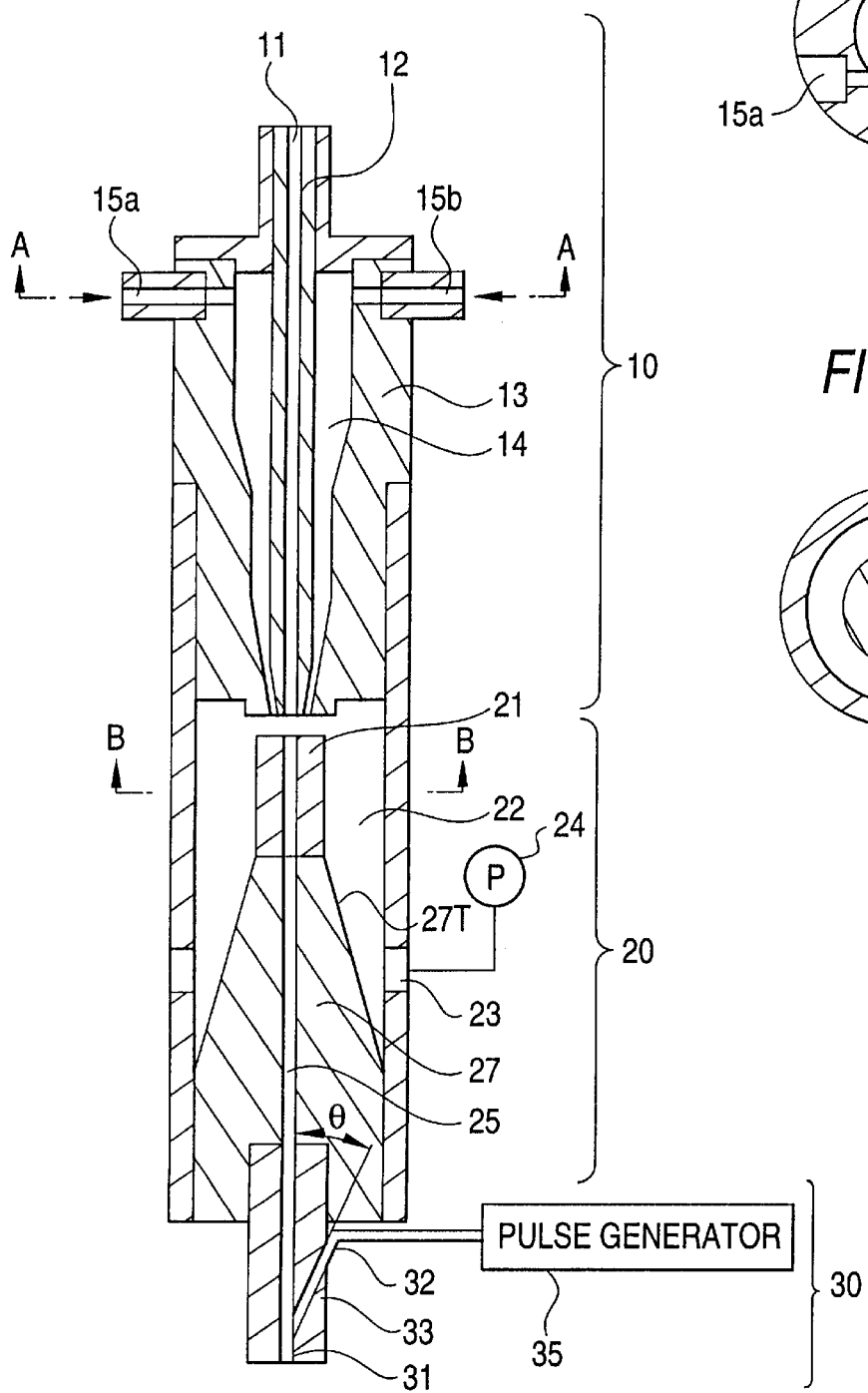
FIG. 1A is a sectional view to show a first embodiment of a conveying apparatus of the invention.
FIG. 1B is a sectional view taken on line A—A in FIG. 1A.
FIG. 1C is a sectional view taken on line B—B in FIG. 1A.

As shown in FIG. 1A to 1C, a transport apparatus of the invention is characterized by the fact that it has an atmosphere conversion function of removing from a single crystal silicon ball measuring 1 mm in diameter supplied together with reactive gas containing mono-silane ($SiH_4$) and $N_2O$ gas (first reactive gas) from an oxide film formation step using a CVD (chemical vapor deposition) method, the first reactive gas and sending the single crystal silicon ball together with second carrier gas of inert gas to the following treatment step. The transport apparatus comprises a spiral stream formation section 10, a suction and discharge section 20 for sucking the first reactive gas together with a spiral stream, and a sending section 30 for applying a high-pressure pulse of inert gas to the single crystal silicon ball for accelerating the single crystal silicon ball and sending it. FIG. 1B is a sectional view taken on line A—A in FIG. 1A and FIG. 1C is a sectional view taken on line B—B in FIG. 1A.

The spiral stream formation section 10 is made up of an inner pipe of a teflon pipe measuring about 2 mm in inner diameter adapted to allow a single crystal silicon ball together with first reactive gas to pass through from a supply port 11 connected to a CVD system, an outer pipe 13 measuring about 15 mm in inner diameter disposed so as to surround the inner pipe 12, a first transport passage 14 defined between the outer pipe 13 and the inner pipe 12, and two high-pressure supply ports 15a and 15b disposed so as to become symmetrical with respect to a point about the center axis so as to communicate with the first transport passage 14 and piercing the outer wall of the outer pipe 13 for supplying high-pressure gas from the tangent direction. Inert gases are spouted from the high-pressure supply ports 15a and 15b, thereby forming a spiral stream along the pipe wall of the inner pipe 12.

The suction and discharge section 20 is made up of a collection pipe 21 separated from the lower end of the inner pipe 12 by a predetermined distance and made of a porous pipe having a larger diameter than the inner pipe and a cylindrical discharge chamber 22 disposed surrounding the collection pipe. The space in the discharge chamber 22 for sucking and discharging first reactive gas is concatenated with a discharge pump 24 as a pressure reducing device and a collection tank (not shown) cooled to a predetermined temperature through piping from discharge holes 23 disposed along the outer periphery of the downstream portion.

The collection pipe 21 communicates with the inner pipe 12 and measures about 2 mm in inner diameter almost like the inner pipe 12 and about 4 mm in outer diameter. The inside of the discharge chamber 22 is placed in a reduced pressure state by the discharge pump 24, whereby it becomes a negative pressure state relative to the inside of the collection pipe 21 and a single crystal silicon ball sent together with gas containing reactive gas from the CVD system (first reactive gas) comes in contact with a spiral stream rectified through the transport passage 14 at an open end of the inner pipe 12, adiabatically expands in the larger-diameter collection pipe 21, and is efficiently discharged to the discharge chamber 22 together with the spiral stream.

The discharge chamber 22 forms a taper face widening outward downstream from the collection pipe 21 so that the first reactive gas discharged through the collection pipe 21 is efficiently discharged forming a laminar flow along the taper face 27T.

As shown in FIG. 1A, the first reactive gas passes through the discharge holes 23 disposed at predetermined intervals along the outer periphery in the proximity of the downstream end of the discharge chamber 22 and is collected in the collection tank (not shown) by the discharge pump 24.

The porous material used to form the collection pipe is obtained by a method of sintering ceramic, resin, metal powder, etc. A large number of through holes are made in the side walls of the collection pipe 21 positioned in the discharge chamber 22.

The collection pipe 21 is connected at the downstream end to a discharge pipe 25 of a teflon pipe having almost the same inner diameter as the inner pipe and the discharge pipe 25 is connected to the sending section 30 where the single crystal silicon ball is accelerated by second carrier gas of inert gas spouted as a high-pressure pulse and is sent.

The sending section 30 comprises an acceleration pipe 31 and a branch pipe 32 and the acceleration pipe 31 is joined at the upper end to the discharge pipe 25 by a joint tube 33. Branch angle θ of the branch pipe 32 is selected so that the second carrier gas is supplied in a pulse state through a pulse generator (not shown) to the branch pipe 32 and the accelerated inert gas accelerates the single crystal silicon ball and sends it at any desired speed. The branch angle θ is not limited if the single crystal silicon ball can be accelerated. However, preferably the branch angle θ is at least 45 degrees or less, particularly preferably 30 degrees or less, because if the branch angle θ becomes larger than 45 degrees, it is feared that the second carrier gas may flow back into the joint tube, interfering with a move of the single crystal silicon ball.

Next, the operation of the transport apparatus comprising the atmosphere conversion function of the embodiment of the invention will be discussed.

First, the space in the discharge chamber 22 is placed in a negative pressure state relative to the space in the collection pipe by the action of the discharge pump 24 and the inside of the collection pipe 21 made of porous material is also placed in a negative pressure state. Since the inside of the collection pipe 21 is under a negative pressure, first reactive gas containing a single crystal silicon ball sent from the inner pipe 12 in the proximity of the boundary between the collection pipe and the inner pipe 12 comes in contact with an spiral stream formed in the first transport passage 14 and rectified along the outer walls of the inner pipe 12, adiabatically expands, is sucked by the discharge pump, and is discharged smoothly through the discharge chamber 22 and the discharge holes to the discharge chamber 22.

On the other hand, the single crystal silicon ball from which the first reactive gas is removed is accelerated by a pulse of the second carrier gas of inert gas in the sending section 30 and is sent at predetermined intervals.

Thus, the single crystal silicon ball together with the second carrier gas of inert gas, etc., is accelerated in a state in which the atmosphere of mono-silane ($SiH_4$), $N_2O$ gas, etc., used in the preceding step is removed, and is sent to the following step.

Preferably, the space in the discharge chamber 22 is controlled to a predetermined temperature to efficiently collect the atmosphere.

The collection pipe 21 is made of a porous material, but the invention is not limited to it. A large number of through holes may be made in the side walls of the collection pipe 21 positioned in the discharge chamber 22. Ceramic, resin, metal, or each of the materials coated with a resin, or the like matched with the transport atmosphere, such as inert gas or water, can be used as the material of the collection pipe 21. The number of the through holes made in the side walls of the collection pipe 21 and the bore of each through hole can be set arbitrarily in a range not interfering with smooth transport of ball substances.

The collection pipe 21 may also be made of a porous material provided by sintering ceramic, resin, metal, etc. In this case, through holes need not be made in the side walls of the collection pipe 21, thus the cost of manufacturing the collection pipe can be reduced. Gases, etc., in the collection pipe 21 are introduced into the collection tank through the discharge chamber 22 over a wide area due to the differential pressure caused by the actuation of the discharge pump. The first carrier gas atmosphere together with the spiral stream is removed efficiently from the full inner peripheral surface, thus is hard to remain in the collection pipe.

To use a resin as the material of the collection pipe 21, fluororesin is preferred from the viewpoints of heat resistance, chemical resistance, and sinter moldability.

Preferably, inert gas for forming a spiral stream is controlled to a predetermined temperature, whereby while the inert gas passes through the first transport passage 14 and is rectified, the single crystal silicon ball and the first carrier gas in the inner pipe 12 can also be heated or cooled.

Figure 2:
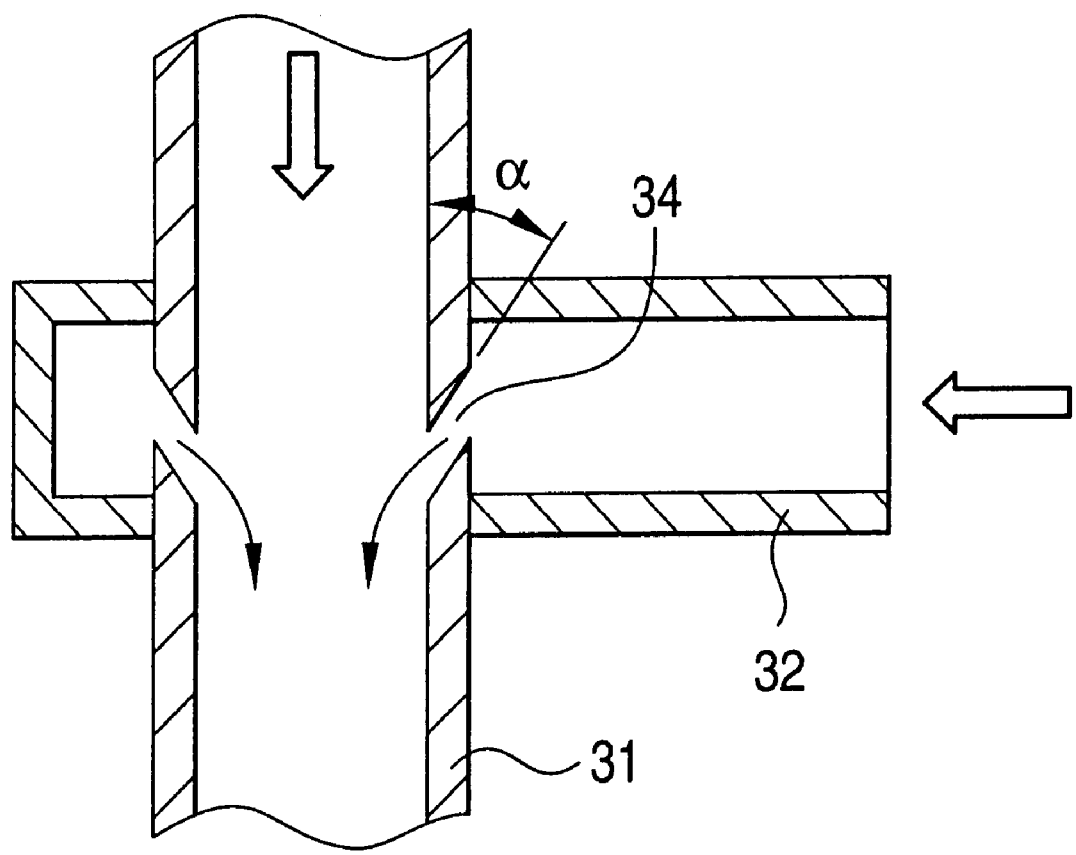
FIG. 2 is a sectional view of a main part to show a sending section of a second embodiment of the invention on an enlarged scale.

Next, there is shown a modified example of the sending section as a second embodiment of the invention. As shown in FIG. 2, the sending section 30 can better convey acceleration energy to a single crystal silicon ball by inclining the sending direction from the supply direction. The sending section 30 is provided with an acceleration pipe 31 for applying an inert gas pulse as a second reaction gas to a single crystal silicon ball in the sending direction and a branch pipe 32. The acceleration pipe 31 is joined at the upper end to a discharge pipe 25 by a joint tube (not shown).

As shown in Fig.2, the branch pipe 32 branches from a predetermined point of the acceleration pipe 31. The acceleration pipe 31 has a plurality of supply holes 34 from outer surface to inner surface of the acceleration pipe 31 at a connected portion with the branch pipe 32. The supply holes 34 are penetrated so as to be inclined by angle α in the conveying direction of the spherical objects. As same as the branch angle θ, the angle α is not limited within a range that an inert gas spouted into the acceleration pipe 31 can accelerate the spherical object sufficiently. Preferably it is at least 45 degrees or less, particularly preferably 30 degrees or less, because if the angle α becomes larger than 45 degrees, it is feared that the inert gas may flow back into the upper flow side of the acceleration pipe 31, interfering with a move of the single crystal silicon ball.

Thereby accelerated inert gas supplied to the branch pipe 32 described later from a pulse generator 35 can accelerate the single crystal silicon ball and send it.

The connection position of the branch pipe 32 is not limited; the acceleration pipe 31 is preferably connected at a near position to the collection pipe 21 to minimize the pressure loss of second carrier gas supplied from the position.

The second carrier gas supply nozzle is attached to the tip of a supply tube extending from the pulse generator (not shown) for spouting second carrier gas made of argon gas as an acceleration fluid into the branch pipe 32. The second carrier gas spouted into the branch pipe 32 is jetted into the acceleration pipe 31 from the branch point through supply holes 34, accelerating and sending a single crystal silicon ball moved from the joint tube 33 to the inside of the acceleration pipe 31.

Since the sending direction can be inclined relative to the supply direction only by changing the inclined angle of supply holes, the transport apparatus is effective particularly for executing treatment at a large number of stages in sequence.

Next, a third embodiment of the invention will be discussed.

Figure 3:
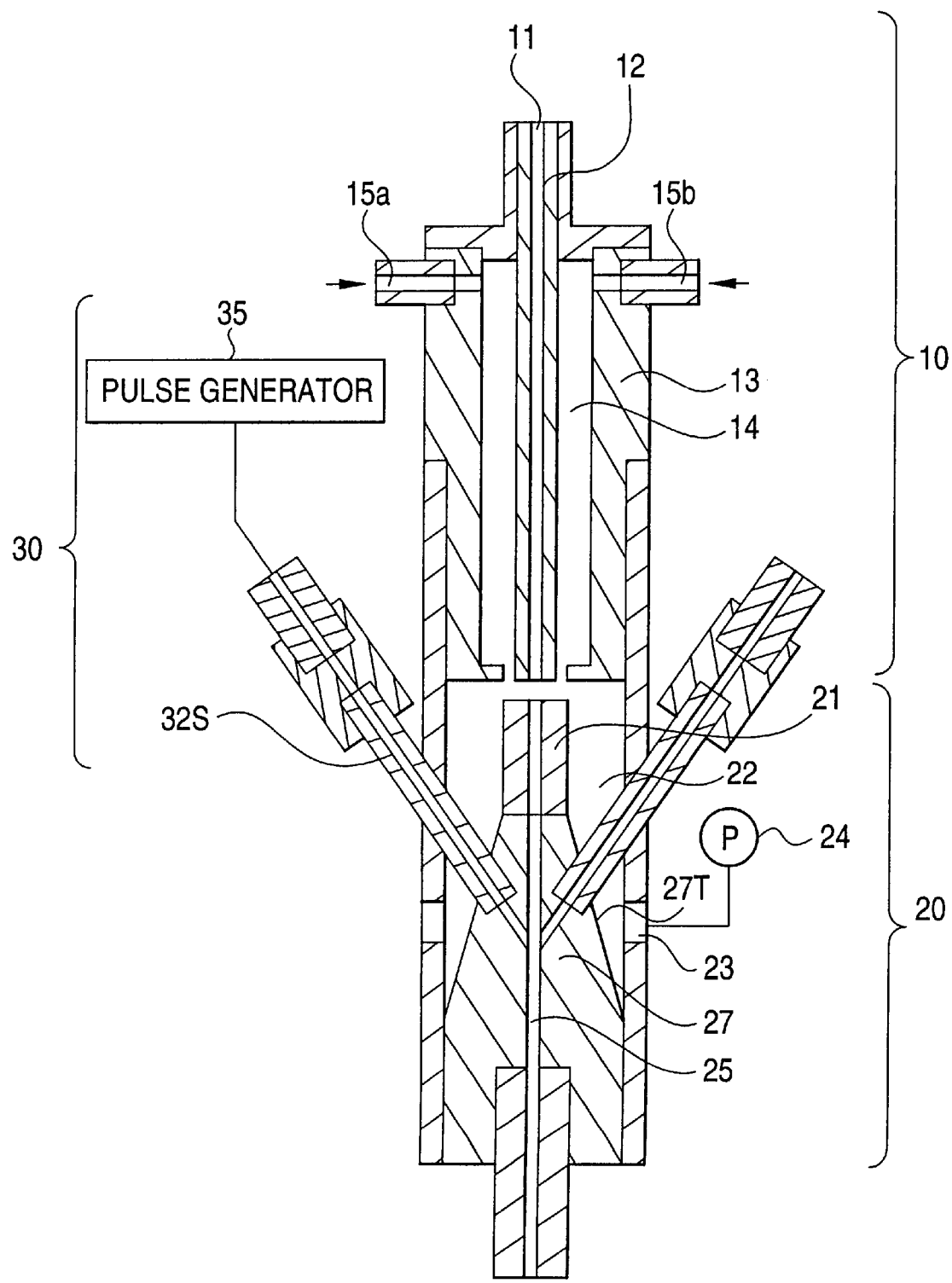
FIG. 3 is a sectional view to show a third embodiment of a conveying apparatus of the invention.

In this embodiment, it is characterized in that the sending section 30 is disposed nearer from the collection pipe 21. As shown in fig.3, a branch tube 32S is disposed so as to penetrate the discharge chamber 22. Immediately after a first atmosphere surrounding the spherical objects is discharged in the collection pipe 21, the spherical objects are accelerated by the second carrier gas and sent to the following steps appropriately. And in this embodiment, a first passage 14 is different from the first embodiment, and consist of strait portion having a small diameter portion at the end thereof. Other portions are same as the first embodiment shown in FIG. 1A–1C.

A fourth embodiment of the invention will be discussed.

In this embodiment, without disposing a collection pipe 21, a spiral stream and a single crystal silicon ball containing first reactive gas are brought into contact with each other in the vicinity of the exit of a first transport passage 14 for forming a spiral stream, then the first reactive gas together with the spiral stream is spread to the outside.

Figure 4:
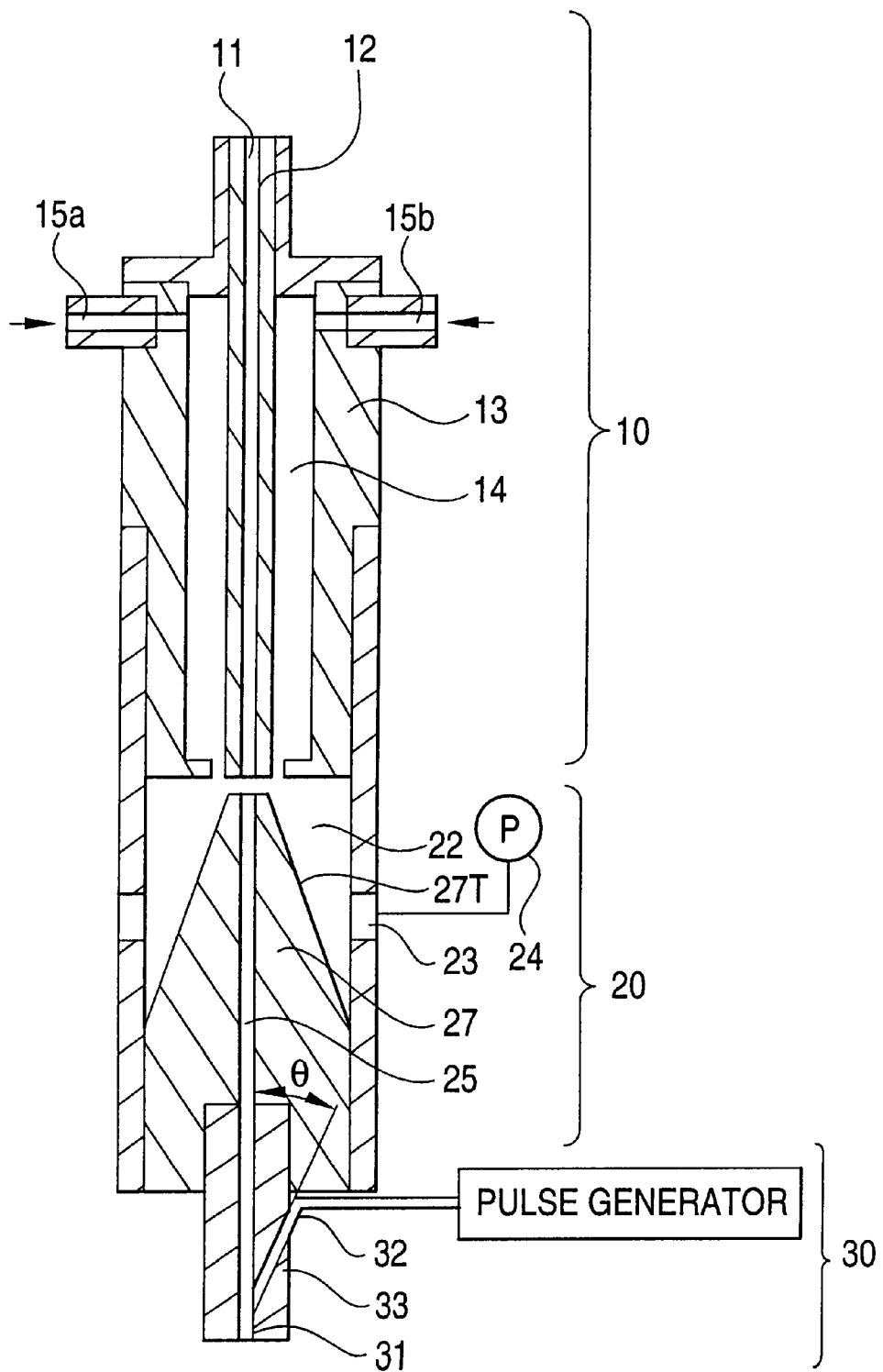
FIG. 4 is a sectional view to show a fourth embodiment of a conveying apparatus of the invention.

As shown in FIG. 4, the embodiment is characterized by the fact that in a suction and discharge section 20, an inner pipe 12 is disposed passing through a small space having a large diameter directly without a collection pipe of porous pipe so that the inner periphery of the inner pipe 12 passes through the center of a discharge chamber 22. Thereby, a spiral stream into contact with a first atmosphere containing a spherical object at an opening of the spiral stream, selectively sucks the first reactive gas outward so as to engulf in the spiral stream for diffusing the first reactive gas outward from the spherical object along the taper face 27T of the taper portion 27 of inner face or the discharge chamber 22, and the discharge pipe 25 is disposed so as to pass through a center of the discharge chamber 22. In the discharge chamber, the first reactive gas is removed and the spherical single crystal silicon is guided so as to pass through the center of the conveying apparatus to sending section 30. The fourth embodiment is the same as the first embodiment in other parts.

According to the apparatus of the fourth embodiment, it is also made possible to execute efficient atmosphere conversion.

Thus, in the invention, the first reactive gas of the first atmosphere used in the preceding step is sucked and removed through the space in a discharge chamber 22 and an atmosphere used in the following step is introduced into an acceleration pipe 31 through a sending section 30, so that the atmospheres are not mixed.

If it is necessary to remove the remaining reactive gas in the preceding step for replacing the atmosphere completely, the exhaust efficiency of an discharge chamber may be raised as shown in a fifth embodiment of the invention or more than one apparatus may be connected in series as shown in a sixth embodiment of the invention.

Figure 5A:
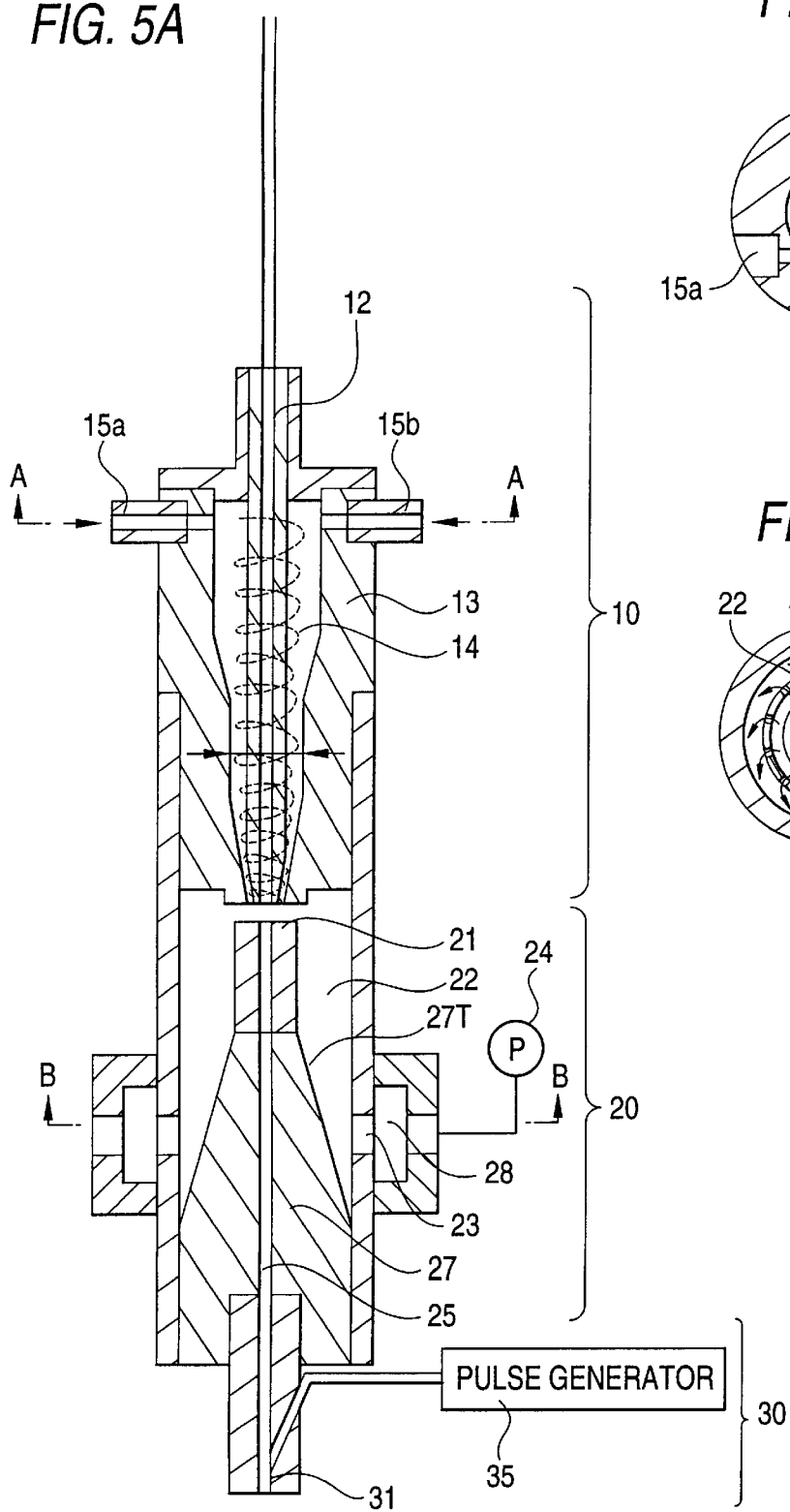
FIG. 5A is a sectional view to show a fifth embodiment of a conveying apparatus of the invention.
Figure 5B:
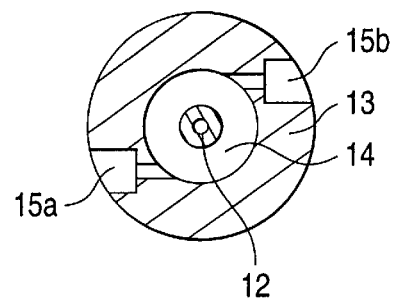
FIG. 5B is a sectional view taken on line A—A in FIG. 5A.
Figure 5C:
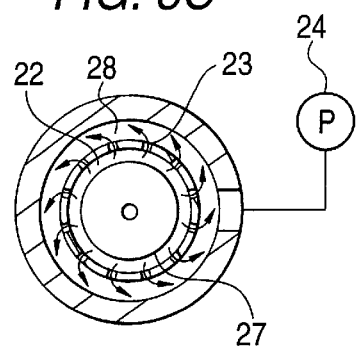
FIG. 5C is a sectional view taken on line B—B in FIG. 5A.
Figure 6:
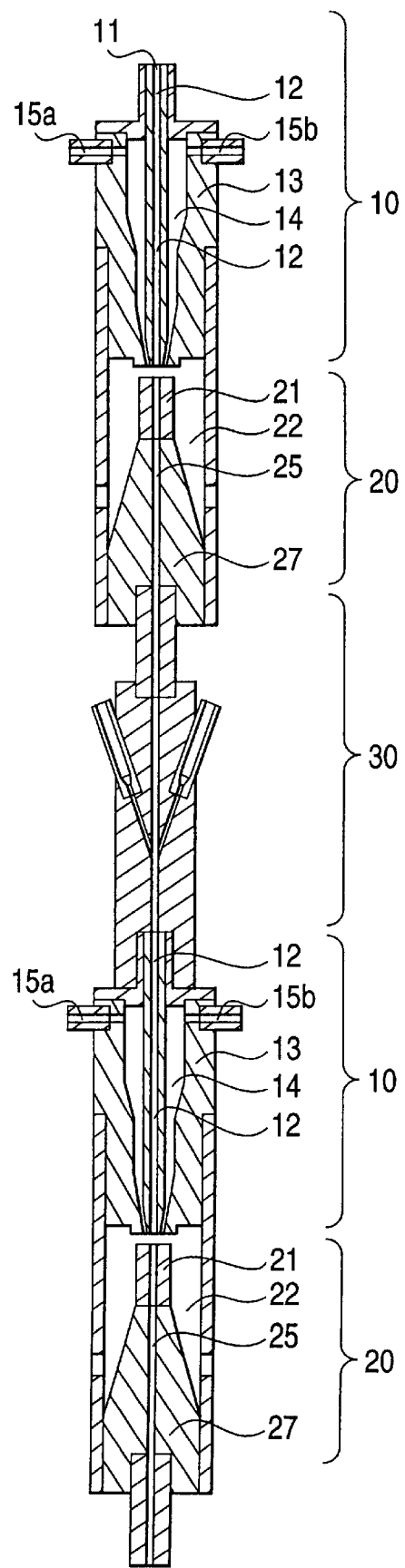
FIG. 6 is a sectional view to show a sixth embodiment of a conveying apparatus of the invention.

First, the fifth embodiment of the invention will be discussed. As shown in FIGS. 5A–5C, discharge holes 23 are placed on a concentric circle at predetermined intervals along the outer peripheral surface of an discharge chamber 22 and a vacuum chamber 28 is disposed like a belt on the outer peripheral surface of the discharge chamber so as to surround all the discharge holes 23 and is connected to an discharge pump 24 for discharging a first atmosphere to the outside. FIG. 5A is a sectional view of the transport apparatus of the fourth embodiment of the invention, FIG. 5B is a sectional view taken on line A—A in FIG. 5A, and FIG. 5C is a sectional view taken on line B—B in FIG. 5A.

According to the apparatus, as shown in FIG. 4C, a spiral stream and a first reactive gas transported downstream through a taper face 27T form a uniform flow and are well discharged to an outer peripheral wall as spiral stream, so that the discharge efficiency is furthermore enhanced.

The fifth embodiment of the invention will be discussed.

In the fifth embodiment, more than apparatus shown in the first embodiment is connected in series. According to the configuration, replacement efficiency improves.

As described above, in the invention, the atmosphere in the preceding step is engulfed, accelerated, and efficiently removed by a spiral stream and an atmosphere or inert gas in the following step is spouted to a spherical object placed in a negative pressure state for sending the spherical object. Atmosphere conversion in treatment steps of spherical objects of spherical single crystal silicon, etc., can be executed without the need for a complicated mechanism or control.

If gas used in two consecutive steps is highly reactive, two apparatuses of the invention may be used in such a manner that the gas is once replaced with inert gas in the first apparatus and the inert gas is replaced with gas in the following step in the second apparatus.

If inert gas controlled to any desired temperature is supplied as a carrier fluid to form a spiral stream, a treated substance of spherical single crystal silicon, etc., can be introduced under the desired temperature at high speed, making it possible to anneal the treated substance at high temperature extremely easily.

Further, if reactive gas controlled to any desired temperature is supplied as the second reactive gas, uniform film forming or etching treatment can be executed efficiently for a treated substance of spherical single crystal silicon, etc., in a small amount of gas.

Further, the composition of supplied gas can also be changed from oxidizing gas to nitrogen-containing gas for forming an oxide film and a nitride film consecutively.

Further, the following configuration is also possible: A first gas supply chamber and a first gas discharge chamber are positioned upstream and a second gas supply chamber and a second gas discharge chamber are positioned downstream so that the first gas supply chamber is used as a nitriding treatment chamber for supplying a nitrogen-containing gas controlled to a nitriding treatment temperature and performing nitrogen annealing and that the second gas supply chamber is used as a temperature adjustment chamber adapted to supply a gas under a room temperature.

According to the configuration, nitriding treatment can be executed with extremely good workability and easily in the transport step from the preceding step to the following step.

To manufacture MOS devices using spherical single crystal silicon, solar batteries, etc., such a transport apparatus also enables the devices to be formed without being taken out to the air by combining a transport passage, a rotary relay, gases, etc., in a closed space.

For example, MOSFET can also be formed in a closed space without touching the air only by providing spherical single crystal silicon, grinding in a grinding device, transporting it by using the transport apparatus of the invention, and supplying and discharging controlled gases.

That is, first, spherical single crystal silicon is washed, a natural oxide film on the surface is removed, a gate insulating film is formed by thermal oxidizing, and a polycrystalline silicon layer is formed by executing a CVD step, then a gate electrode is formed by patterning the polycrystalline silicon layer by executing a photolithography step.

After an interlayer insulating film is formed, a polycrystalline silicon film containing desired impurities is formed on the surface, source drain diffusion is executed from the polycrystalline silicon film for forming a source drain region, and the polycrystalline silicon layer is used as a source drain contact layer.

Last, electrode formation is executed, whereby MOSFET is formed in a closed space extremely efficiently.

The apparatus enables desired surface treatment to be executed in an extremely small amount of gas and can use a spiral stream to efficiently discharge the gas in the preceding step and replace with gas in the following step, thus making it possible to form semiconductor devices with good yield and high reliability without peel or flaws. In the embodiments, supply and discharge when gases are used as the atmosphere gases and carrier fluid are described, but the invention is also applicable to the case where liquid is used.

A gas containing a reducing gas of hydrogen, halogen, etc., may be used as the carrier fluid.

What is claimed is:

1. An apparatus for exchanging an atmosphere surrounding a spherical object comprising:

spiral stream formation means for allowing a carrier fluid to flow in from a tangent direction of a tubular flow passage and forming a spiral stream of the carrier fluid;

a supply pipe for supplying a spherical object together with a first atmosphere;

a first atmosphere suction and discharge section for bringing the first atmosphere containing the spherical object into contact with the spiral stream in the proximity of an exit of said supply pipe for guiding the spherical object so that the spherical object passes through a center and selectively sucking outward and discharging the first atmosphere together with the spiral stream for removing the first atmosphere; and a second atmosphere supply section for supplying a second fluid for forming a second atmosphere to the spherical object sent out from said suction and discharge section for sending out the spherical object together with the second fluid.

2. The apparatus for exchanging an atmosphere surrounding a spherical object as claimed in claim 1 wherein said first atmosphere suction and discharge section comprises:

an inner pipe being connected to a point in the proximity of the exit of said supply pipe for enabling a fluid to flow in and out and defining a passage of the spherical object in said inner pipe; and a discharge chamber surrounding said inner pipe.

3. The apparatus for exchanging an atmosphere surrounding a spherical object as claimed in claim 2, wherein said discharge chamber is a cylindrical pipe formed so as to surround said inner pipe for discharging through discharge holes disposed on an outer peripheral surface in the proximity of a downstream end.

4. The apparatus for exchanging an atmosphere surrounding a spherical object as claimed in claim 3 wherein the discharge holes comprise a plurality of holes arranged at intervals on the same circumference along the outer peripheral surface.

5. The apparatus for exchanging an atmosphere surrounding a spherical object as claimed in claim 4 wherein the first atmosphere and the spiral stream are made of gases, further including a vacuum chamber disposed like a belt on the outer peripheral surface of said discharge chamber so as to surround all the holes, said vacuum chamber comprising a vacuum pump for discharging the first atmosphere to the outside.

6. The apparatus for exchanging an atmosphere surrounding a spherical object as claimed in claim 3 wherein said inner pipe is a porous pipe made of a porous material formed so as to define a passage having a diameter slightly larger than that of the spherical object in said pipe.

7. The apparatus for exchanging an atmosphere surrounding a spherical object apparatus as claimed in claim 3 wherein said inner pipe is a pipe having a large number of through holes each having a diameter smaller than that of the spherical object for enabling the first atmosphere to pass therethrough.

8. The apparatus for exchanging an atmosphere surrounding a spherical object as claimed in claim 3 wherein said inner pipe is a pipe formed of a mesh material capable of preventing the spherical object from flowing out to the outside.

9. The apparatus for exchanging an atmosphere surrounding a spherical object as claimed in claim 2 wherein said discharge chamber is a cylindrical pipe formed so as to surround said inner pipe with an inner peripheral surface forming a taper face enlarged downstream and approaching an outer peripheral surface of said cylindrical pipe for discharging the spiral stream.

10. The apparatus for exchanging an atmosphere surrounding a spherical object as claimed in claim 9 wherein the spiral stream is discharged through a discharge hole in a downstream end of the taper face.

11. The apparatus for exchanging an atmosphere surrounding a spherical object as claimed in claim 1 wherein said first atmosphere suction and discharge section comprises:
- a straight pipe section made of a porous material being connected to a point in the proximity of the exit of said supply pipe for enabling a fluid to flow in and out and defining a passage of the spherical object in said straight pipe section;
- a taper section having an inner peripheral surface forming a taper face enlarged downstream and approaching an outer peripheral surface for discharging the spiral stream; and
- a discharge chamber formed so as to surround at least said straight pipe section.

12. The apparatus for exchanging an atmosphere surrounding a spherical object as claimed in claim 1 wherein said spiral stream formation means comprises a tubular body disposed so as to define a spiral stream passage outside said supply pipe and fluid supply means for supplying a fluid from a tangent direction to a point in the proximity of an upstream end on an outer peripheral surface of said tubular body, wherein said fluid supply means causes a fluid to blow into from the tangent direction of the outer periphery of the passage, thereby forming a spiral stream along the passage.

13. The apparatus for exchanging an atmosphere surrounding a spherical object as claimed in claim 12 wherein the spiral stream passage comprises an opening for injection at a downstream end.

14. The apparatus for exchanging an atmosphere surrounding a spherical object as claimed in claim 13 wherein the fluid is a gas for forming the second atmosphere.

15. The apparatus for exchanging an atmosphere surrounding a spherical object as claimed in claim 12 wherein the spiral stream passage comprises:
- a straight section defined by an outer peripheral surface of a straight inner pipe and an inner peripheral surface of an outer pipe and having a constant cross-sectional area; and
- an opening for injection at a downstream end, being connected to said straight section.

16. The apparatus for exchanging an atmosphere surrounding a spherical object as claimed in claim 12 wherein the spherical object is single crystal silicon and the fluid is inert gas.

17. The apparatus for exchanging an atmosphere surrounding a spherical object as claimed in claim 1 wherein said spiral stream formation means forms a spiral stream of inert gas controlled to a cooling temperature.

18. The apparatus for exchanging an atmosphere surrounding a spherical object as claimed in claim 1 wherein said second atmosphere supply section comprises pulse generation means for supplying the second fluid as a pressurizing pulse and accelerates and sends the spherical object.

* * * * *